United States Patent
Reed et al.

(10) Patent No.: US 9,373,479 B2
(45) Date of Patent: Jun. 21, 2016

(54) HIGH-SPEED MULTIFRAME DYNAMIC TRANSMISSION ELECTRON MICROSCOPE IMAGE ACQUISITION SYSTEM WITH ARBITRARY TIMING

(71) Applicant: Lawrence Livermore National Security, LLC, Livermore, CA (US)

(72) Inventors: Bryan W. Reed, Livermore, CA (US); William J. Dehope, Pleasanton, CA (US); Glenn Huete, Tracy, CA (US); Thomas B. LaGrange, Brentwood, CA (US); Richard M. Shuttlesworth, Brentwood, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 14/851,692

(22) Filed: Sep. 11, 2015

(65) Prior Publication Data
US 2016/0005567 A1     Jan. 7, 2016

Related U.S. Application Data (63) Continuation of application No. 14/181,321, filed on Feb. 14, 2014, now Pat. No. 9,165,743.

(51) Int. Cl.
*H01J 37/075*     (2006.01)
*H01J 37/26*     (2006.01)
(Continued)

(52) U.S. Cl.
CPC ............ *H01J 37/075* (2013.01); *H01J 37/1472* (2013.01); *H01J 37/22* (2013.01); *H01J 37/244* (2013.01); *H01J 37/26* (2013.01); *H01J 37/265* (2013.01); *H01J 2237/0432* (2013.01); *H01J 2237/06333* (2013.01); *H01J 2237/15* (2013.01);
(Continued)

(58) Field of Classification Search
USPC ........................................................ 250/311
See application file for complete search history.

(56) References Cited

U.S. PATENT DOCUMENTS 5,270,643 A * 12/1993 Richardson ...... G01R 31/31922
324/73.1
7,557,977 B2     7/2009   Oron et al.
(Continued)

OTHER PUBLICATIONS

Reed, B. W. et al. "The Evolution of Ultrafast Electron Microscope Instrumentation," Microsc. Microanal, vol. 15, 2009, pp. 272-281.
(Continued)

*Primary Examiner* — Kiet T Nguyen
(74) *Attorney, Agent, or Firm* — Harness, Dickey & Pierce, PLC (57) ABSTRACT

An electron microscope is disclosed which has a laser-driven photocathode and an arbitrary waveform generator (AWG) laser system ("laser"). The laser produces a train of temporally-shaped laser pulses of a predefined pulse duration and waveform, and directs the laser pulses to the laser-driven photocathode to produce a train of electron pulses. An image sensor is used along with a deflector subsystem. The deflector subsystem is arranged downstream of the target but upstream of the image sensor, and has two pairs of plates arranged perpendicular to one another. A control system controls the laser and a plurality of switching components synchronized with the laser, to independently control excitation of each one of the deflector plates. This allows each electron pulse to be directed to a different portion of the image sensor, as well as to be provided with an independently set duration and independently set inter-pulse spacings.

20 Claims, 2 Drawing Sheets

(51) Int. Cl.
  *H01J 37/22* (2006.01)
  *H01J 37/244* (2006.01)
  *H01J 37/147* (2006.01)
(52) U.S. Cl.
  CPC .... *H01J 2237/151* (2013.01); *H01J 2237/2447* (2013.01); *H01J 2237/2449* (2013.01); *H01J 2237/24455* (2013.01); *H01J 2237/24495* (2013.01)

(56) References Cited

U.S. PATENT DOCUMENTS

| | | | |
|---|---|---|---|
| 8,933,401 | B1 | 1/2015 | Reed |
| 9,165,743 | B2 * | 10/2015 | Reed ..................... H01J 37/075 |
| 2005/0253069 | A1 | 11/2005 | Zewail et al. |
| 2006/0235693 | A1 | 10/2006 | Ruderman et al. |
| 2010/0108882 | A1 | 5/2010 | Zewail |
| 2011/0168888 | A1 | 7/2011 | Reed et al. |
| 2011/0220791 | A1 | 9/2011 | Reed |
| 2011/0220792 | A1 | 9/2011 | Zewail et al. |

OTHER PUBLICATIONS

Dorner, H. et al. "High-Speed Transmission Electron Microscope," Review of Scientific Instruments, vol. 74, No. 10, Oct. 2003, pp. 4369-4372.

Niu, H. et al. "Picosecond Framing Technique Using a Conventional Streak Camera," AIP Review of Scientific Instruments, vol. 52, 1981, pp. 1190-1192.

Yang, J. et al. "Low-emittance Electron-Beam Generation With Laser Pulse Shaping in Photocathode Radio-Frequency Gun," AIP Journal of Applied Physics, vol. 92, 2002, pp. 1608-1612.

Bowers, Mark et al. "The Injection Laser System on the National Ignition Facility," SPIE Photonics West, Jan. 20, 2007-Jan. 25, 2007, 20 pages.

Park, Hyun Soon et al. "4D Ultrafast Electron Microscopy: Imaging of Atomic Motions, Acoustic Resonances, and Moire Fringe Dynamics," Ultramicroscopy, vol. 110, 2009, pp. 7-19.

Browning, Nigel D. et al. "Dynamic Transmission Electron Microscopy." Handbook of Nanoscopy (2012), 35 pages.

LaGrange, Thomas et al. "Approaches for Ultrafast Imaging of Transient Materials Processes in the Transmission Electron Microscope," Micron, vol. 43, No. 11, Nov. 2012, pp. 1108-1120.

Kang, J. S. et al. "Development of a Dynamic Transmission Electron Microscope (DTEM) for the Study of Self-Propagating Reactions in Multilayer Foils," Microsc Microanal, vol. 11 (Suppl 2), 2005, pp. 484-485.

LaGrange, Thomas et al. "Nanosecond Time-Resolved Investigations Using the In Situ of Dynamic Transmission Electron Microscope (DTEM)," Ultramicroscopy, vol. 108, No. 11, Oct. 2008, pp. 1441-1449.

LaGrange, Thomas et al. "Single-Shot Dynamic Transmission Electron Microscopy," Applied Physics Letters, vol. 89, 2006, pp. 044105-1-044105-3.

LaGrange, Thomas et al. "The Development of a Flexible Laser Platform for Photoemission Based, High-Time Resolution Electron Microscopes," Microsc. Microanal., vol. 18 (Suppl 2), 2012, pp. 594-595.

"AWG Converts Light to Rapid-Fire Pulses," Laser Focus World, vol. 37, No. 7, Jul. 1, 2001, 9 pages.

"Dynamic Imaging with Electron Microscopy," Science & Technology Review, Sep. 2013, 27 pages.

Takaoka, Akio and Ura, Katsumi. "Stroboscopic TEM with Time Resolution of 30 .mu.s," J. Electron Microsc., vol. 32, No. 4, 1983, pp. 299-304.

LaGrange, Thomas T. et al. "Movie Mode Dynamic Transmission Electron Microscopy (DTEM): Multiple Frame Movies of Transient States in Materials with Nanosecond Time Resolution," Microscopy and Microanalysis, Nashville, TN, Aug. 7, 2011-Aug. 11, 2011,3 pages.

Tarri, Kimmo et al. "Partial Nephrectomy With a Combined Co.sub.2 and Nd:YAG Laser: Experimental Study in Pigs," Lasers in Surgery and Medicine, vol. 14, 1994, pp. 23-26.

Toytman, I. et al. "Multifocal Laser Surgery: Cutting Enhancement by Hydrodynamic Interactions Between Cavitation Bubbles," Physical Review E, vol. 82, No. 046313, 2010, 11 pages.

Takasago, Kazuya et al. "Generation of Amplified Picosecond Square Pulses for Low Emittance Electron Generation in Photocathode RF-Gun," http://web.archive.org/web/20040301000000*/http://www.stonybrook.edu/icfa- 2001/Papers/w3-1.pdf; believed to be at least Mar. 4, 2004, 11 pages.

* cited by examiner

FIGURE 1

HIGH-SPEED MULTIFRAME DYNAMIC TRANSMISSION ELECTRON MICROSCOPE IMAGE ACQUISITION SYSTEM WITH ARBITRARY TIMING

CROSS-REFERENCE TO RELATED APPLICATIONS

This application is a continuation of U.S. application Ser. No. 14/181,321, filed Feb. 14, 2014. The entire disclosure of the above application is incorporated herein by reference.

FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

This patent document relates to electron microscopes, and in particular, to a high-speed multi-frame dynamic transmission electron microscope image acquisition system with arbitrary timing.

BACKGROUND

Small objects tend to evolve over short timescales. For example, in chemistry, biology, and materials science, a sequence of changes no more than a nanometer in size can pass by in a microsecond, leaving behind little evidence. Reconstructing these processes and determining how and why they took place can be a difficult task. Many techniques can record the static, before and after states of materials, some even at high spatial resolutions, but they often lack the temporal resolution to capture the nearly instantaneous changes occurring in between.

For example, conventional transmission electron microscopy/microscopes (TEM) is a well-established technique/instrument using electrons instead of light for investigating material properties and structure at size scales from micrometers to angstroms at the atomic level. TEMs operate on the same principles as a light microscope but substitute electrons for light to achieve much higher spatial resolution. Electron microscopes typically generate electrons through thermionic emission, in much the same way an incandescent bulb uses heat to produce light, or through field emission, which combines a metallic conductor and an electrostatic field. Electrons emitted by a source, usually at the top of the microscope, are typically focused by magnetic lenses into a narrow beam and directed through a thin specimen. Depending on the specimen's material properties, for example its density and crystalline structure, some of the electrons are scattered and used to form an image or diffraction pattern. Subsequent lenses in the TEM column magnify this image or pattern onto a fluorescent screen. The resulting light and dark regions provide information about the materials examined, including their crystalline grain structure, dislocations, or even single atomic rows and columns. A camera at the bottom of the microscope then records the data. Conventional TEMs produce a steady stream of electrons that pass through the optical column one at a time, and achieve the desired beam parameters using small apertures with lenses to discard all but a fraction of the current.

Despite the relatively high spatial resolutions (i.e. spatial resolutions higher than light microscopes) achievable by conventional TEM microscopes, their relatively low temporal resolutions (e.g. second- or millisecond-scale) are often inadequate to capture the fast dynamic processes in materials, e.g. microstructured or nanostructured materials, which occur at such small size scales. In particular, conventional TEM measurements are made at roughly standard video frame rates (e.g. ~24 frames per second), which are governed by the electron source current and brightness and the capabilities of the image acquisition systems, and which are often thousands or even millions of times slower than the rate at which processes typically evolve in microstructured or nanostructured materials. Such material processes also are often unique, never unfolding exactly the same way twice, necessitating single-shot high-speed acquisition for their study. Examples include mechanical deformation and the interaction between phase transformations and microstructure. To capture dynamic behavior with a conventional TEM microscope, researchers must start and stop a process, which is not always feasible and rarely precise.

Dynamic transmission electron microscopy (DTEM) is another methodology similar to and modified from conventional TEM technology for investigating material properties and structure. A microscope making use of DTEM technology, however, can capture transient processes/events in materials with enhanced (e.g. nanosecond-scale) time resolution as a high quality image or diffraction pattern of the state of a material at some known time interval after an event has begun. In contrast to conventional TEM instruments, which produce a steady stream of electrons (such as produced by thermionic emission) that pass through the optical column one at a time, a DTEM instrument releases electrons in a single burst as an extremely brief (e.g. 1 ns to few microseconds timescales) bright electron pulse operating at high electron current, producing billions of electrons in a pulse. The high current is typically achieved through photoemission, driven by a pulsed laser (e.g. ultraviolet laser) directed upon a metal cathode, such as for example a tantalum disk. In particular, the laser is arranged to direct a pulse of light into the optical column of the TEM where it may be reflected by a mirror onto the cathode to release a burst of electrons. The electron pulse emitted from the electron source is then accelerated through a system of condenser lenses that focus and point the beam upon the investigated sample. It is notable that while conventional TEMs achieve the desired beam parameters using small apertures with lenses to discard all but a fraction of the current, the lens system of a DTEM microscope is typically designed with additional condenser lenses and an extra focusing (crossover) region, and also with a reduced number of apertures, to maximize electron throughput while focusing the beam down to a small spot on the sample to boost spatial resolution. Furthermore, the duration of the laser pulse determines the "exposure time" for recording the image or diffraction pattern.

In this manner, a DTEM microscope controls the electron emission such that it is correlated in time with the transient process being studied, which is typically triggered or initiated by a pulsed laser striking the material, though other methods are possible. As a result, a DTEM microscope produces a brighter, higher current beam than a conventional TEM with little sacrifice in beam coherence (which affects image contrast and diffraction-pattern sharpness). In addition, researchers can adjust the lens's focal length to control how much of the beam is used in an experiment. Because a DTEM microscope acquires sufficient information in a single experiment to generate a high-resolution image of a micro- to nanosecond-long, nanoscale event, irreversible events such as phase transformations, chemical reactions and crystal growth can be studied.

Unfortunately, standard DTEM microscopes are configured for single shot operation to only capture a single image or diffraction pattern per sample drive event/camera read-out time, which is typically on the scale of milliseconds to seconds. Thus many of the details of complex, unique processes may still be lost. Single-shot DTEM experiments are typically repeated on fresh specimens as often as required, each with a different time delay, and the collection of images are combined into an averaged view of the process over time. While an averaged view is sufficient for studying reactions that are nearly identical every time, and while a high time-resolution single image provides some research value, they lack the ability to scrutinize more complex or variable behavior and fast material processes ranging from phase transformations to chemical reactions and nanostructure growth.

SUMMARY

In one example implementation the present disclosure is directed to an electron microscope comprising a plurality of components including a laser-driven photocathode and an arbitrary waveform generation (AWG) laser system. The AWG laser system may be used for producing a train of temporally-shaped laser pulses of a predefined pulse duration and waveform, and arranged to direct the laser pulses to the laser-driven photocathode for producing a train of electron pulses. A first lens stack may be included which is arranged to focus the train of electron pulses to a sample. A second lens stack may be used to produce a magnified image or diffraction pattern of the sample on an image sensor. The deflector subsystem may have electrostatic deflector plates arranged downstream of the sample upstream of the image sensor. The deflector plates may comprise a first pair of plates and a second pair of plates arranged perpendicular to the first pair of plates. A controller may be in communication with both the AWG laser system and the deflector subsystem. The controller may control a plurality of switching components synchronized with the AWG laser system for rapidly and reversibly switching voltage signals applied to each one of the deflector plates to independently control excitation of each one of the deflector plates. The excitation of the deflector plates may be synchronized with the train of laser pulses to direct each electron pulse to a different portion of the image sensor. In this manner the image sensor can be used to capture a high-speed sequence of images or diffraction patterns of the sample. In effect, each electron pulse is provided with an independently set duration controlled by the controller. The controller also controls the spacings between sequentially generated ones of the electron pulses so that the spacings are independent, variable and programmable from one another.

In another aspect the present disclosure relates to an electron microscope comprising a laser-driven photocathode and an arbitrary waveform generation (AWG) laser system. The AWG laser system is used for producing a train of temporally-shaped laser pulses having programmable pulse durations and programmable inter-pulse spacings, and arranged to direct the laser pulses to the laser-driven photocathode for producing a train of electron pulses. A first lens stack is arranged to focus the train of electron pulses to a sample. A second lens stack produces a magnified image or diffraction pattern of the sample. An image sensor may also be incorporated. A control system may be included for controlling a deflector subsystem, with the deflector subsystem having a first pair of spaced apart electrostatic deflector plates and a second pair of spaced apart deflector plates arranged perpendicular to the first pair of electrostatic deflector plates. Both pairs of electrostatic deflector plates are arranged downstream of the target and upstream of the image sensor. Four independent voltage supplies, one controlling the voltage on each plate, controlled by the control system may be incorporated and synchronized with the AWG laser system. A plurality of switching elements may also be included which are controlled by the control system for generating switching signals to independently control an application of high voltage signals to each one of the deflector plates of both pairs of deflector plates. The control system is configured to independently and rapidly reversibly switch the high voltage signals applied to each of the deflector plates in synch with the train of laser pulses so as to direct each electron pulse to a different portion of the image sensor to capture a high-speed sequence of images or diffraction patterns of the sample.

In still another aspect the present disclosure relates to a method for performing dynamic transmission electron microscopy (DTEM). The method may comprise providing a laser-driven photocathode. An arbitrary waveform generation (AWG) laser system may be used to generate a train of temporally-shaped laser pulses having programmable pulse durations and programmable inter-pulse spacings. The temporally-shaped laser pulses may be directed at the laser-driven photocathode for producing a train of electron pulses emitted from the laser-driven photocathode. The train of electron pulses may be focused to a sample. An image sensor may be used to receive the train of electron pulses downstream of the sample after the train of electron pulses has impinged the sample. A deflector subsystem may be used which has a first pair of electrostatic deflector plates and a second pair of electrostatic deflector plates arranged perpendicular to the first pair of deflector plates. The first and second pairs of deflector plates are arranged downstream of the sample but upstream of the image sensor, to controllably deflect the train of electron pulses onto selected subportions of the image sensor. A controller may be used which is in communication with both the AWG laser system and the deflector subsystem. The controller may be in communication with a plurality of switching components synchronized with the AWG laser system to rapidly and reversibly switch voltage signals applied to each one of the deflector plates, to thus independently control excitation of each one of the deflector plates and to synch operation of the deflector subsystem with the train of laser pulses. In this manner each of the electron pulses may be directed to a different portion of the image sensor to capture a high-speed sequence of images or diffraction patterns of the sample. The controller may also be used to provide each electron pulse with an independently set duration controlled by the controller and to provide spacings between sequentially generated ones of the electron pulses that are variable and independently controllable by the controller.

In other various implementations the present disclosure provides an electron microscope is provided comprising: a laser-driven photocathode; an arbitrary waveform generation (AWG) laser system for producing a train of temporally-shaped laser pulses of a predefined pulse duration and waveform, and arranged to direct the laser pulses to the laser-driven photocathode for producing a train of electron pulses; a lens stack arranged to focus the train of electron pulses to a sample; a second lens stack producing a magnified image or diffraction pattern of the sample; an image sensor; and a deflector having electrostatic deflector plates arranged downstream of the sample upstream of the image sensor, and synchronized with the laser system to rapidly and reversibly switch the deflector plate voltages in synch with the train of laser pulses so as to direct each electron pulse to a different portion of the image sensor to capture a high-speed sequence of images or diffraction patterns of the sample.

In another example implementation an electron microscope is provided comprising: a laser-driven photocathode; an arbitrary waveform generation (AWG) laser system for producing a train of temporally-shaped laser pulses of a predefined pulse duration and waveform, and arranged to direct the laser pulses to the laser-driven photocathode for producing a train of electron pulses; a lens stack arranged to focus the train of electron pulses to a sample; a second lens stack producing a magnified image or diffraction pattern of the sample; an image sensor; a deflector having electrostatic deflector plates arranged downstream of the sample upstream of the image sensor; a controller connected to the deflector and synchronized with the laser system for rapidly and reversibly switching the deflector plate voltages in synch with the train of laser pulses, so as to direct each electron pulse to a different portion of the image sensor to capture a high-speed sequence of images or diffraction patterns of the sample.

In its various implementations, the present invention is generally directed to a high-speed multi-frame dynamic transmission electron microscope image acquisition system with arbitrary timing that is capable of acquiring multiple images or diffraction patterns on the nanosecond to microsecond scale before, during, and after a single sample drive event. As such the present invention may be characterized as a "movie-mode" DTEM that is capable of investigating fast, complex or variable material processes, events, or behavior, such as for example a branching growth front, phase transformation initiated from many sites, chemical reactions, and nanostructure growth. The various embodiments may make use of an arbitrary-waveform generation laser to drive the photocathode in a TEM. The Gaussian pulses obtained in a conventional pulsed laser do not produce as bright of an electron pulse as those produced by the laser system of the present disclosure. The various implementations described herein enable completely programmable and arbitrarily sequenceable pulse trains to be produced. All previous similar systems were limited to a single pulse length and a single interframe time (or, at most, variable only over a very small range) in an acquisition sequence. The various implementations described herein can produce any sequence one would want, including mixing multiple-microsecond-exposure images (which will have higher spatial resolution) and nanosecond-exposure images (which are needed to capture things moving extremely fast) completely arbitrarily, with virtually any sequence of movie-mode deflector settings one can imagine.

The various implementations include a deflector subsystem that can be inserted and removed while maintaining its alignment. The deflector subsystem can produce adequate deflection at reasonable voltages with minimal image distortion. The DTEM produced by the various implementations described herein has numerous advantages over single-shot DTEM. With movie-mode DTEM, researchers can watch the formation, movement, growth, and interaction of individual crystal grains, defects, phase fronts, and chemical reactions. They can also gather more data in fewer experiments, which is especially helpful when specimens are difficult to obtain or time consuming to prepare. In materials science, reactions often happen quickly and then slow down. The movie-mode operation of the present invention may be used to tailor the image spacing and exposure time to focus on the important events. In addition, by using movie-mode, a high-resolution image of the 'before' state, i.e. what the sample is like immediately before the laser drive hits it, may be acquired before the material process/event is triggered or initiated.

DTEM may be used for exploring irreversible nanoscale material processes and providing insights into controlling these processes and material properties. The range of potential applications is just starting to emerge as the technology becomes more widely adapted. For instance, DTEM is a promising tool for biological research. Standard TEMs image biological samples in a fixed or frozen state, and although a light microscope can view life processes, it has only one-tenth of DTEM's spatial resolution. DTEM should be able to capture high-resolution images of biological events in liquid water such as protein binding and host-pathogen interactions. The present invention can also explore material behavior in atmospheric environments, as opposed to under vacuum.

The present invention integrates an arbitrary-waveform generation laser system with a high-speed deflector system arranged for synchronous operation with the laser system and capable of bidirectional, two-dimensional image shifting on the nanosecond scale. This enables a relatively large number (e.g. 9, 16, or 25) of frames with completely arbitrary choice of exposure times and interframe delay times for every single frame. This also enables experimental flexibility needed for high-time-resolution in situ transmission electron microscopy. In particular, the present invention enables multiple acquisitions with complete flexibility over exposure times and interframe times on the nanosecond to multiple-microsecond time scale.

The arbitrary temporal profile producible by the arbitrary-waveform laser generation system of the present invention can be tuned to produce the best possible effective electron source brightness, which can enhance DTEM performance in movie-mode and even in single-shot operation.

The system of the present invention may be configured for 9-frame acquisition with 15-ns exposure times and variable (~200 ns) interframe times. All of these parameters can be easily varied. Exposure times from ~5 ns to multiple µs (possible with the current hardware), interframe times as low as ~10-20 ns (with minor modification of the electronics) and frame counts of 16 or 25 (with expansion of existing electronics) are all possible, as is streak imaging or streak diffraction in which the timing is adjusted so that the frame shifts are programmed to occur during the pulsed exposure.

The system of the present invention can be programmed for arbitrary sequences switching among 9 (with existing hardware) or 25 (with a simple upgrade) frames with complete control over the timing of the laser and frame shifting, even going back to earlier positions if desired (which was impossible with previous DTEM systems).

The integration of an arbitrary-waveform laser generation system with a DTEM has several advantages. Besides the ability to easily change exposure times for different experiments, it has been observed that there is a substantial increase in brightness of the electron pulse owing to the exceptional spatial quality and (likely more important) flat temporal profile of the laser beam. This improvement, which translates into improvements in signal-to-noise ratio, spatial coherence, and resolution, is believed to arise from space-charge effects in the electron gun.

Generally, the arbitrary-waveform generation laser on the DTEM operates to segment and amplify a seed laser with acousto-optical modulators and fiber amplifiers, modulate it with electro-optic modulators, and send the result into solid-state laser amplifiers for higher power. The DTEM system, for example, only has one arbitrary-waveform laser output and is required to produce arbitrary waveforms multiple µs in duration.

The movie-mode DTEM of the present invention enables unique, complex events to be watched in complete detail, from start to finish, in materials driven to extreme conditions (e.g. high temperatures or temperature gradients, high stresses, or nonequilibrium states produced by direct impingement of intense lasers). Without such a multi-frame modification, a DTEM can only capture one snapshot from each sequence of events, while the modification allows each individual event to be captured in detail. Thus the modification dramatically expands the relevant experimental range of DTEM in the area of materials dynamics under extreme conditions. It also improves the signal levels, spatial coherence, resolution, and reciprocal space resolution of a DTEM.

Relative to all similar systems such as single-shot DTEM, the movie-mode DTEM provides greater experimental flexibility by enabling researchers to tailor temporal-spatial resolution to fit the experimental needs. Material processing for electronic and optoelectronic devices, dynamics of nanostructured materials including catalysts and reactive nanolaminates, and (potentially) biological or biological-like analogue processes have all been investigated for study in single-shot DTEM, with significant basic research gains already demonstrated in several of these areas. Put differently, the MM DTEM improved the spatial resolution to the already improved temporal resolution of single shot DTEM.

Movie-mode DTEM (MM-DTEM) can record nine complete images or diffraction patterns in 2 microseconds, with variable delay between the frames, enabling the in-depth study of an individual, irreversible process. Even for highly repeatable reactions, movie mode can help researchers determine the full event sequence and the rate at which changes occur.

In movie mode, after a laser pulse initiates the material process, a series of laser pulses hits the cathode and generates an electron pulse train. The train passes through the sample, and a deflector, synchronized with the laser system, diverts each pulse onto a different region of a camera that is sensitive enough to image individual electrons. The camera stores the data in on-chip buffers that are read out after the experiment and segmented into frames. To make movie mode possible, the researchers upgraded the laser hardware and software and added the deflector to direct images onto the camera.

Further areas of applicability will become apparent from the description provided herein. It should be understood that the description and specific examples are intended for purposes of illustration only and are not intended to limit the scope of the present disclosure.

DRAWING DESCRIPTIONS

The drawings described herein are for illustration purposes only and are not intended to limit the scope of the present disclosure in any way. In the drawings.

DETAILED DESCRIPTION

Figure 1:
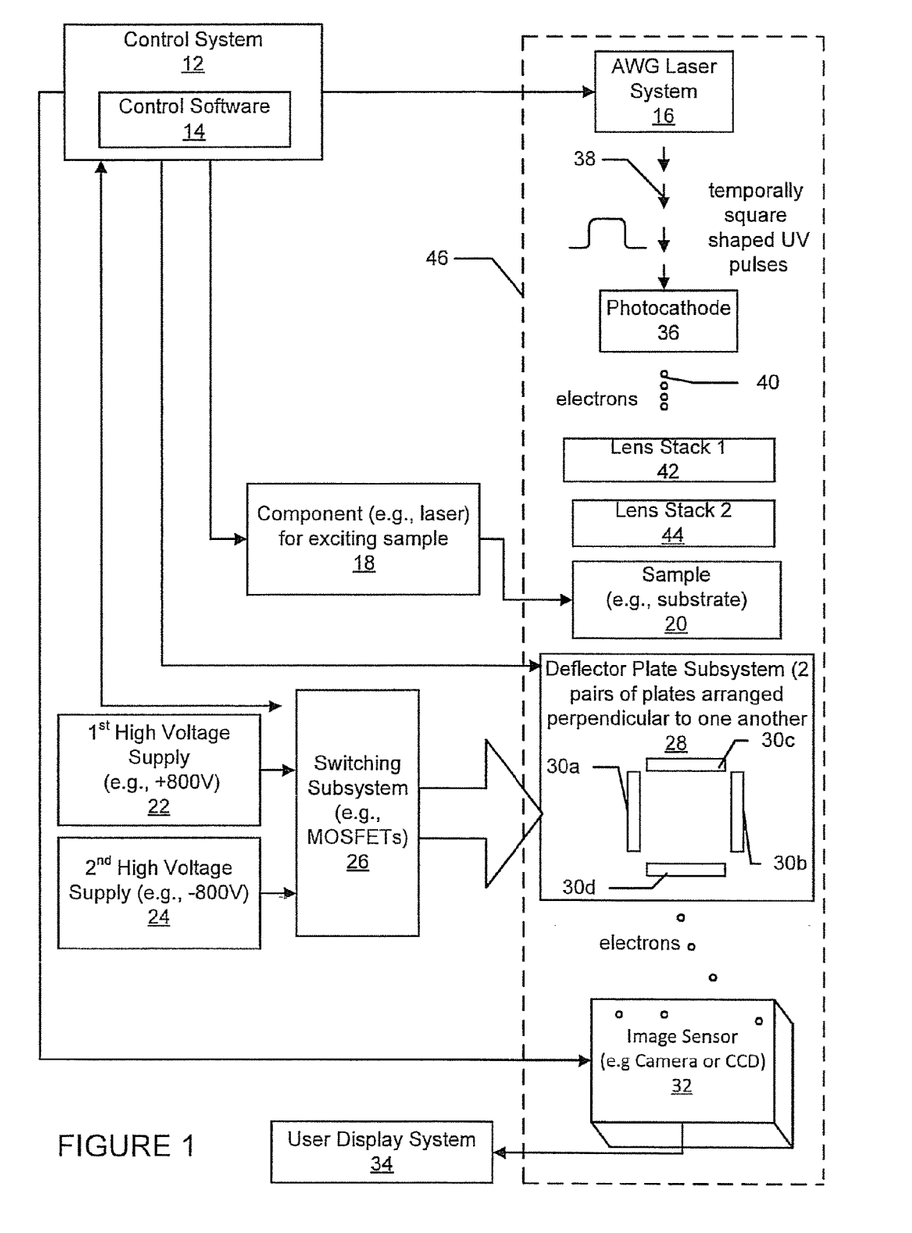
FIG. 1 is a high level block diagram of one example of an implementation of the subject matter of the present disclosure.

Turning now to the drawings, FIG. 1 shows a first embodiment of the high speed multi-frame DTEM image acquisition system 10 (hereinafter simply "system 10") in accordance with one example embodiment of the present disclosure. In this example the system 10 may comprise a control system 12 having suitable control software 14. The control system 12 and the software 14 control an arbitrary waveform generation ("AWG") laser system 16, as well as an instrument 18, for example a laser, for exciting a sample 20 (e.g., substrate or "target"). The control system 12 and the control software 14 further control the application of voltage signals from +800V and −800V high voltage supplies 22 and 24, respectively, by controlling a switching subsystem 26. The switching subsystem 26 may comprise a plurality of switching elements, for example MOSFET semiconductor switches. Depending on the polarity of the MOSFET switches and the desirability of independently controlling all of the deflector voltages balanced against the cost and complexity of the system, it is possible to drive the system with a single high-voltage supply or with as many as four independent high-voltage supplies (one for each deflector plate).

The system 10 further includes a deflector subsystem 28 having a plurality of electrostatic deflector plates which may be independently energized by the control system 12 selectively controlling the switching subsystem 26. In this example the deflector subsystem 28 includes two pairs of deflector plates 30a/30b and 30c/30d. The first pair of deflector plates 30a/30b are arranged in this example parallel to one another and spaced apart from one another. The second pair of deflector plates 30c/30d are arranged parallel to one another but perpendicular to the first pair of deflector plates 30a/30b. Since each plate can be independently energized, this provides a total of 16 deflector-plate states if the system uses four MOSFET switches.

The control system 12 also controls an image sensor, in this example a charge coupled device 32 ("CCD"). An output of the CCD 32 may be in communication with a user display system 34.

The system 10 may further include a photocathode 36 arranged downstream of the AWG laser system 16 to receive optical pulses 38 from the system 16. When the optical pulses 38 impinge the photocathode 36 they cause electrons 40 to be discharged from the photocathode. The electrons 40 in this example are directed through a first focusing lens stack 42 before they impinge and pass through the sample 20, after which they pass through a second lens stack 44. The electrons 40 thereafter are controllably deflected by the electric fields created by the pairs of deflector plates 30a/30b and 30c/30d, as controlled by the control system 12, so that they impinge on specific regions of the CCD 32. The information collected by the CCD 32 may then be displayed on a suitable user display system 34 for viewing and study by the user. In FIG. 1, the AWG laser system 16, the photocathode 36, the first and second lens stacks 42 and 44, the deflector plate subsystem 28 and the CCD 32 may form a DTEM microscope 46.

Arbitrary Waveform Generator (AWG) Laser System 16

The AWG laser system 16, operating in connection with the control system 12, is an important component of the system 10. The AWG laser system 16, operating in connection with the control system 12, overcomes the nonlinearities associated with frequency conversion and produces a train of temporally "square" ultraviolet (UV) laser pulses. This is in part accomplished through the programming (i.e., control software 14) of the control system 12 used with the AWG laser system 16. Specifically, sequencing is implemented by the control software 14 in long duration UV optical pulses which are temporally segmented. For example, a 500 ns pulse requires a large number of adjustable parameters to provide a temporally flat pulse at the photocathode 36. Without this capability, the performance of the photocathode 36 is dramatically degraded. The AWG laser system 16 of the present invention can produce square UV pulses (pulses 38 in FIG. 1) to produce brighter electron pulses over an unprecedented range of pulse durations timed precisely on a nanosecond level with the electron deflector plate subsystem 28, to produce multi-frame movies on nanosecond timescales.

The AWG laser system 16 combines a high-speed (1.25 GHz sample rate for this implementation), digital-to-analog arbitrary signal generator, a continuous-wave (CW) seed laser, and a series of laser amplifiers (both fiber-based and free space solid-state) and electro-optic and acousto-optic modulators (AOMs and EOMs). It may also include a refractive optic and a series of lens relays and pinhole spatial filters designed to produce an extraordinarily flat spatial profile with a distinct lack of what are commonly called "hot spots." This flat spatial profile is extremely important for the efficient conversion of infrared photons first to ultraviolet photons and then to high-brightness photoemitted electrons. The system 10 is capable of modulating and amplifying a seed laser of the AWG laser system 16 to produce an arbitrarily-shaped series of the optical pulses 38 over an interval up to hundreds of microseconds in length, with a total energy per pulse series in the 100 millijoule to joule range. In particular, the AWG laser system 16 can generate laser pulses with durations estimated to range from a few nanoseconds to 250 microseconds, with inter-pulse delays similarly estimated to range from a few nanoseconds (estimated 5 ns) to many microseconds, with totally flexible control over the durations, intensities and delays of each pulse 38. When used to drive the photocathode 36, the AWG laser system 16 then causes the photocathode to produce a similar arbitrarily definable series of the electron pulses 40 inside the DTEM 46, with each pulse 40 containing enough electrons (typically ~$10^7$ to $10^9$) to produce a high-quality image or diffraction pattern. Laser driven photoemission is the only currently available means by which a sufficient number of electrons can be produced in such a short pulse. The AWG laser system 16 used in the system 10 has the high energy and excellent beam quality ($M^2 < 1.2$) needed to produce bright, coherent electron pulses.

Perhaps even more importantly, the pulse waveform from the AWG laser system 16 can be tuned to be nearly perfectly flat as a function of time. This has a substantial effect on the effective brightness of the electron pulses 40 emitted from the photocathode 36. Because of space charge effects, the apparent cathode position (i.e. the position from which the electrons appear to be emerging, when back-projected from far-field asymptotes) is a function of the photoemitted current. A typical pulsed laser has a temporal profile approximating a Gaussian bell-shaped curve. If such a pulse is used for a photoemission source, then the current will follow another bell-shaped curve (modulated by space-charge nonlinearities) and thus the apparent cathode position will vary with time during the pulse. This variation happens far too quickly for a standard lens system to compensate, and even a sufficiently fast electrostatic lens system would be very difficult to tune for this purpose. As a result, the electron beam can only be in focus for a fraction of the pulse duration. Said another way, the apparent source position must be integrated over the duration of the pulse to yield the effective apparent source size, which will then be much larger than the real physical source size at any given time. The net result is a beam with degraded brightness. The temporally flat pulses 38 produced by the AWG laser system 16 do not suffer from this problem. As a result, the effective brightness of the DTEM's 46 photoemission source is substantially higher with the AWG laser system 16 than it would be with a conventional pulsed laser. In addition, the steady-state current from an electron gun is limited by the Child-Langmuir law, which sets a maximum current solely based on the gun geometry and extraction voltage. The brightness will be maximized when the gun is operated at this limit for the entire duration of a pulse. Therefore, a square pulse set at the intensity to reach this limit will produce a brighter electron pulse than, for example, a nominal Gaussian-shaped pulse.

The system 10 of the present invention is completely programmable and arbitrarily sequenceable. Previous similar systems were limited to a single pulse length and a single interframe time (or, at most, variable only over a very small range) in an acquisition sequence. The system 10 of the present invention can produce virtually any pulse sequence one desires, mixing multiple-microsecond-exposure images (which will have higher spatial resolution) and nanosecond-exposure images (which are needed to capture things moving extremely fast) completely arbitrarily, with virtually any sequence of movie-mode deflector settings from the deflector subsystem 28 that one would need.

The DTEM's 46 AWG laser system 16 has been designed to be more programmable, flexible and durable for achieving the smooth beam profile required to generate a desirable electron pulse. This is expected to enable researchers to define an experiment's timescale and tailor the laser parameters accordingly. The AWG's laser system's 16 optical modulator controls the laser pulse 38 spacing, shape, and other details, enabling unprecedented temporal ranges. For example, the laser pulses 38 that create the electron pulses 40 can last from 10 nanoseconds to 1 microsecond, and frame spacing can range from 50 nanoseconds to 150 microseconds.

The AWG laser system's 16 benefits do not end there. With so many electrons packed into the DTEM's 46 relatively tight electron pulses 40, electrons in the microscope column frequently collide with and repel one another, potentially degrading image resolution. For example, information encoded in the trajectories of individual electrons as they pass through the sample 20 (i.e., target) can be lost when those electrons later bounce off one another. The affected electrons reform their pattern in a different way on the imaging screen, causing stochastic blurring of the resulting image. This is a difficult problem to mitigate.

Electron-electron interactions can also disperse the electron pulse. The electron optics in the DTEM 46 of the system 10 partially compensate for this type of blurring. In addition, the AWG laser system 16 can temporally shape the pulses 38 to minimize these effects in the photocathode 36 and increase brightness.

Electron repulsion effects essentially set the lower limit for the spatial resolution of previously developed DTEMs as currently designed. Fortunately, not all experiments require nanosecond time resolution. The AWG laser system 16 offers the ability to trade off spatial resolution and exposure time. Experiments designed to study somewhat slower processes, such as certain catalytic reactions and crystallization, can use longer pulses and thus exposure times. Because long pulses experience fewer electron interactions than short ones, they can generate more electrons to boost the signal and spatial resolution. Even the longest pulses produced by a DTEM are four orders of magnitude shorter in time than the exposure times of a conventional TEM.

Sample Drive Laser 18

The DTEM 46 has a highly precise, adjustable and powerful heating element—an additional pulsed sample drive laser 18, for initiating the dynamic process to be probed, yielding temperatures and heating rates far beyond those offered by a standard TEM. The sample drive instrument (e.g., laser 18 in FIG. 1) is synchronized with the AWG laser system 16 to control the time that elapses between heating and the electron pulse arriving at the sample 20. The control system 12 and control software 14 also allow researchers to specify the conditions for initiating a material process. Other methods of initiating processes in the sample are also employed through electrically triggered sample holders, or external electronics connected to sample holders, that may deliver a voltage pulse, a current pulse, an electrically driven heat pulse, or an impulse delivered through a nanoindentation or microelectromechanical system.

Instead of heating an entire sample at once, when using a pulsed sample drive laser the DTEM 46 confines heating to an area less than 100 micrometers across, enabling users to isolate both fast and slow reactions. For instance, at high temperatures, many metals undergo phase transformations within picoseconds (10-12 seconds) to microseconds, while oxidation occurs more slowly. The gradual, uniform heating available in a conventional TEM cannot separate the two processes. With the DTEM's 46 specimen laser 18 and nanosecond acquisition rates, researchers can quickly heat a sample, capture transformations before the sample has time to oxidize, and compare those results to the properties of an unheated sample.

Deflector Subsystem 28

Figure 2:
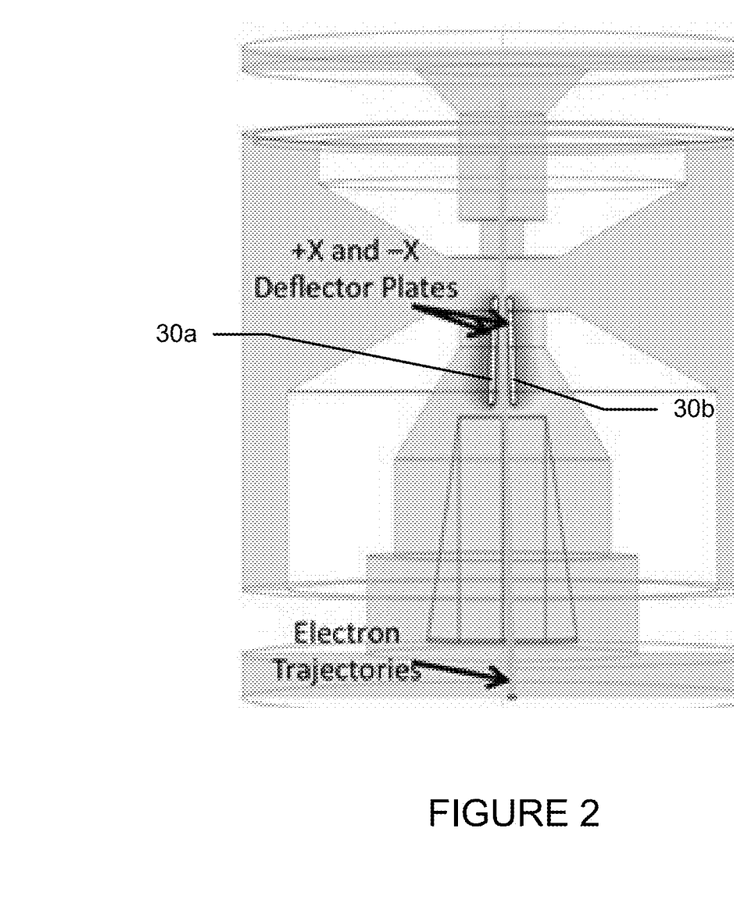
FIG. 2 is highly simplified side view diagram of one pair of deflector plates that make up the deflector subsystem of the present system.
Figure 3:
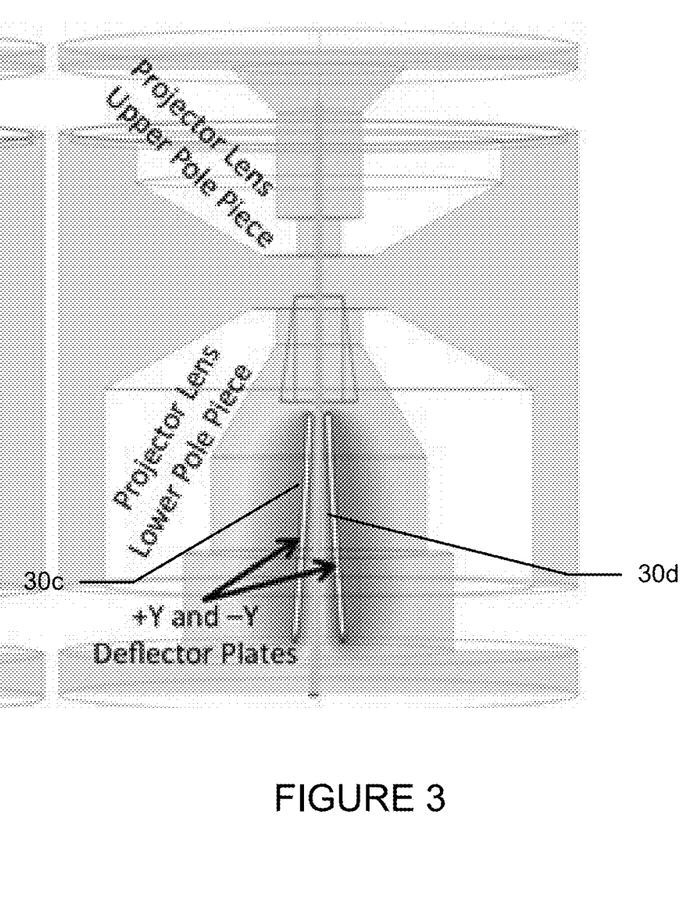
FIG. 3 is a highly simplified side view diagram of a second pair of deflector plates that make up the deflector subsystem.

As shown further in FIGS. 2 and 3, the deflector subsystem 28 is an accurately timed, high-speed electrostatic deflector array in which four high-voltage switches (of switching subsystem 26) connected to customized deflectors plates 30a/30b and 30c/30d are inserted into the projector lens below the sample 20. The deflector plates 30a/30b and 30c/30d deflect each image to a different part of the camera 32, thereby overcoming the camera's multisecond refresh rate. The current design creates nine frames with 512 by 512-pixel resolution, but other arrangements are possible.

The electrostatic deflector in this example consists of the set of 4 plates 30a, 30b, 30c and 30d placed, in this implementation, within the lower part of the projector lens, being the last electromagnetic lens in a standard TEM. FIGS. 2 and 3, which are two orthogonal cross sections through the projector lens pole piece (a pre-existing part of the transmission electron microscope) shown the locations and approximate shapes of the four deflector plates 30a, 30b, 30c and 30d. Each plate 30a, 30b, 30c and 30d may independently carry a voltage ranging from −800V to +800V, allowing complete flexibility over the electron deflection in two dimensions. The camera itself is roughly 50 cm below this set of deflectors, so that the electron beam can be directed to any part of the camera (i.e., CCD 32). The space between the deflector plates 30a-30d and the projector lens polepiece is partially filled with a ceramic mounting, alignment, and electrical connection system integrated with the deflector plates 30a, 30b, 30c and 30d. The deflector subsystem 28 can be inserted and removed while maintaining its alignment.

Other positions for the deflector subsystem 28, for example within an intermediate lens system, are also possible. The deflector subsystem 28 can direct each of the electron pulses 40 to a different region on a large camera (i.e., CCD 32), thereby spatially separating the various images and diffraction patterns captured by each electron pulse. The image produced by the camera (or CCD 32) then consists of an array (typically 2×2, 3×3, 4×4, or 5×5) of images and diffraction patterns captured from different points in time. The camera (e.g., CCD 32) itself does not need high time resolution; the time resolution of the system comes from the arbitrary pulse train and the fast switching of the deflector subsystem 28. However, future evolutions of this technology are envisioned may use other emerging camera technologies such that hundreds of frames can be acquired.

Programmable Electronic Timing and Control System

Finally, the electronic control system 12, fully synchronized with the AWG laser system 10 (in one implementation, using digital outputs from the very same electronic unit that generates an analog pulse train), independently controls the voltage on each of the four deflector plates 30a, 30b, 30c and 30d. Unlike previous implementations, each plate 30a, 30b, 30c and 30d may be rapidly set and reset in an arbitrary sequence of positive, negative, and zero voltage settings. This control can be achieved through an array of digitally-controlled MOSFET switches in the switching subsystem 26 that connect the two high voltage supplies 22 and 24 (set, for example, to +800V and −800V) independently to each of the plates 30a, 30b, 30c and 30d. All cabling is sufficiently impedance matched and terminated that the time resolution is dictated by the switching time of the MOSFET switches or the subsystem 26. Using current off-the-shelf components (e.g., made by Directed Energy, Inc.), this switching time is on the order of 100 nanoseconds or less, though we expect future upgrades may even further improve on this performance. Thus the system 10 can be set to direct any of the electron pulses 40 to any region of the CCD 32, provided the interframe time is long enough for the MOSFET switches to function. With each pair of plates 30a, 30b, 30c and 30d able to be set to five distinct potential differences (e.g. +1600V, +800V, 0V, −800V, −1600V), the resulting array can be as large as 5×5 with only two high-voltage power supplies and eight MOSFET switches. The control system 12 is programmed to avoid connecting the positive and negative voltage supplies to any single plate 30a, 30b, 30c and 30d simultaneously. The magnitude of the high voltage will be adjusted for different array sizes ranging from 2×2 to 5×5, while the centering of the entire array pattern is achieved using a magnetic deflector built into the projector lens system by the original manufacturer of the TEM. This description is only meant as an example of a general mode of operation. Other modes are possible. For example, a 4×4 array can be achieved with only four switches if two different voltage magnitudes are used. Also, electronic components other than conventional MOSFET switches, for example photoconductive switches, could also be used.

The control system 12 and the switching subsystem 26 use standard electronic components coupled with custom LabVIEW™-based software (i.e., control software 14) that enables precise control over the pulse shapes, coordinated switching, and miscellaneous timing integration for the entire system 10.

Typical Operation

In typical operation, the sample drive laser 18, the AWG laser system 16, and the deflector subsystem 28 may follow a pre-defined sequence to drive the sample 20 and acquire images or diffraction patterns at user-specified points in time before, during, and after the sample drive event. The image from the CCD 32 is then read out and digitally segmented into a series of typically 4, 9, 16, or 25 frames (depending on the settings applied). In another operating mode, a camera (e.g., CCD 32) with a fast read-out speed (typically milliseconds for a modern fast TEM camera) is synchronized with the AWG laser system 16 and the deflector subsystem 28 so that acquisition may run continuously, with as many as 25 frames acquired per camera read-out time, thus producing movies with frame rates increased by a factor of up to 25 relative to a standard system. In yet another operating mode, the camera is a fast-framing camera capable of locally storing multiple images with typically microsecond-scale frame switching times. This operating mode would enable hundreds of individual exposures to be recorded in a matter of microseconds. Such fast-framing cameras are typically able to cycle through the set of locally-stored images, with acquisition halted by an external trigger, at which time the camera can report the last (for example) 100 frames so acquired. This would be especially useful for processes like dislocation injection during nanoindentation, the exact onset of which is impossible to predict but which may be detected some microseconds or milliseconds after the fact by monitoring (for example) the force-displacement curves.

Example Embodiment

In one example embodiment as shown in FIG. 1, the lens stack 42 of the DTEM 46 may be of a type having: (1) a fixed aperture (lens stack 42) arranged downstream of the laser driven photocathode 36 so that the electron pulses 40 pass through the fixed aperture, and where the fixed aperture having a radius less than a RMS radius of the electron pulses; (2) a condenser lens system (lens stack 44) arranged downstream of the fixed aperture to focus the electron pulses 40 from the fixed aperture to the sample 20; and (3) an upstream condenser lens (not shown in the drawing) arranged between the laser driven photocathode 36 and the fixed aperture to focus substantially all electrons of the electron pulses 40 from the photocathode 36 through the fixed aperture to the condenser lens system so that the electron pulses 40 pass through the condenser lens system 44 with substantially no aberrations.

The inclusion of the upstream condenser lens arranged in this way enables higher currents (essentially the full current of the source, e.g. micro-amp/milli-amp range, instead of picoamp or nanoamp) to be transferred to the entrance of the condenser lens system, and enables high information data rates and throughput, which is particularly important for enabling the production of time-resolved image data using single shot electron beam pulses. Further, the design of the system 10 to have "substantially no aberrations" means that the RMS brightness (a measure of beam quality that combines current, coherence, and focusability into a single quantity) is not degraded; the RMS brightness reaching the target (e.g. sample 20) is substantially the same as the RMS brightness produced by the photocathode 36. A weak lens is of a type having a focal length f greater than about 100 mm (e.g. f~150-200 mm) for typical operating parameters of the DTEM 46. And a large bore is of a type greater than about 40 mm (e.g. 48 mm).

Because the upstream condenser lens is arranged to focus substantially all electrons of the electron beam pulses from the photocathode 36 through the fixed aperture to the condenser lens system, the fixed aperture does not normally function as a beam delimiter (common in conventional EM systems) which would otherwise reduce the beam current. In this manner, the upstream condenser operates to preserve virtually all the beam current that is generated at the source for transmission to the sample 20.

The upstream condenser lens is an electrostatic or electromagnetic lens, which can be either static or dynamic, with controls for adjusting the focal length and crossover point of the beam. The crossover point is near the first condenser lens (e.g. the C1 lens of a typical TEM design) of the condenser lens system and may be suitably adjusted above the entrance or below the exit of the first condenser lens.

Although the description above contains many details and specifics, these should not be construed as limiting the scope of the invention or of what may be claimed, but as merely providing illustrations of some of the presently preferred embodiments of this invention. Other implementations, enhancements and variations can be made based on what is described and illustrated in this patent document. The features of the embodiments described herein may be combined in all possible combinations of methods, apparatus, modules, systems, and computer program products. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural and functional equivalents to the elements of the above-described preferred embodiment that are known to those of ordinary skill in the art are expressly incorporated herein by reference and are intended to be encompassed by the present claims. Moreover, it is not necessary for a device to address each and every problem sought to be solved by the present invention, for it to be encompassed by the present claims. Furthermore, no element or component in the present disclosure is intended to be dedicated to the public regardless of whether the element or component is explicitly recited in the claims. No claim element herein is to be construed under the provisions of 35 U.S.C. 112, sixth paragraph, unless the element is expressly recited using the phrase "means for."

We claim:

1. An electron microscope, comprising:
   a photocathode;
   a laser system for producing a train of laser pulses of a predefined pulse duration and waveform, wherein the laser system is arranged to direct the train of laser pulses to the photocathode to produce a train of electron pulses;
   a sample holder for retaining a sample, wherein the sample holder is downstream of the photocathode;
   a deflector subsystem having electrostatic deflector plates arranged downstream of the sample holder;
   an image sensor downstream of the deflector subsystem, wherein the image sensor provides signals corresponding to a sequence of images or diffraction patterns of the sample; and
   a control system in communication with the laser system and the deflector subsystem, wherein the control system is synchronized with the laser system for reversibly switching voltage signals applied to each of the deflector plates to independently control excitation of each of the deflector plates to synchronize operation of the deflector subsystem with the train of laser pulses, so as to direct each electron pulse of the train of electron pulses to a portion of the image sensor to provide the signals corresponding to the sequence of images or diffraction patterns of the sample.

2. The electron microscope of claim 1, wherein the control system controls the laser so that a frame shift occurs during at least one of the train of laser pulses.

3. The electron microscope of claim 1, wherein the control system enables multiple images or diffraction patterns to be acquired on at least one of a nanosecond scale or a microsecond scale before, during or after a single sample drive event.

4. The electron microscope of claim 1, wherein a duration of a given electron pulse of the train of electron pulses ranges from about 5 nanoseconds to 250 microseconds.

5. The electron microscope of claim 1, wherein the control system controls the laser system and the deflector subsystem to produce interframe times of at least about 10 nanoseconds.

6. The electron microscope of claim 1, wherein the control system controls the laser system to produce the train of laser pulses as ultraviolet (UV) laser pulses.

7. The electron microscope of claim 6, wherein each laser pulse of the train of laser pulses has a square shape.

8. The electron microscope of claim 1, wherein the laser system includes one or more of a digital-to-analog arbitrary signal generator; a continuous wave (CW) seed laser; a plurality of laser amplifiers; electro-acoustic and acousto-optic modulators; a refractive optic; a plurality of lens relays; and a plurality of pinhole spatial filters.

9. The electron microscope of claim 8, wherein the laser system includes two or more of a digital-to-analog arbitrary signal generator; a continuous wave (CW) seed laser; a plurality of laser amplifiers; electro-acoustic and acousto-optic modulators; a refractive optic; a plurality of lens relays; and a plurality of pinhole spatial filters.

10. The electron microscope of claim 1, wherein the electron microscope produces the train of laser pulses such that each laser pulse of the train of laser pulses has a total energy per pulse of at least about 100 millijoule.

11. The electron microscope of claim 1, wherein the train of laser pulses yields a mixture of multiple microsecond exposure images and nanosecond exposure images on the image sensor.

12. The electron microscope of claim 1, wherein the control system controls an application of a voltage ranging from +800V to −800V to each of the electrostatic deflector plates of the deflector subsystem to deflect one or more electron pulses of the train of electron pulses to selected regions of the image sensor.

13. The electron microscope of claim 12, wherein during use, the train of electron pulses are deflected by the deflector subsystem to produce at least one of a two by two array of images or diffraction patterns; three by three array of images or diffraction patterns; four by four array of images or diffraction patterns; and a five by five array of images or diffraction patterns.

14. The electron microscope of claim 1, wherein the control system is in communication with a switching subsystem that reversibly switches the voltage signals applied to each of the deflector plates.

15. The electron microscope of claim 1, wherein the control system provides a given electron pulse of the train of electron pulses with an independently set and programmable duration.

16. The electron microscope of claim 1, wherein the control system provides variable and/or independently-controlled spacings between sequentially generated electron pulses of the train of electron pulses.

17. The electron microscope of claim 1, wherein the train of laser pulses have substantially flat temporal profiles.

18. The electron microscope of claim 1, wherein the train of laser pulses have substantially flat spatial profiles.

19. The electron microscope of claim 1, wherein each laser pulse of the train of laser pulses has a duration up to about 250 microseconds.

20. The electron microscope of claim 19, wherein each laser pulse of the train of laser pulses has a duration of at least about 5 nanoseconds.

* * * * *